(12) United States Patent
Shtalrid (10) Patent No.: US 8,559,451 B2
(45) Date of Patent: Oct. 15, 2013

(54) TURBO DECODER

(75) Inventor: Udi Shtalrid, Moshav Nir-Israel (IL)

(73) Assignee: Marvell Israel (MISL) Ltd. (IL)

( * ) Notice: Subject to any disclaimer, the term of this patent is extended or adjusted under 35 U.S.C. 154(b) by 1260 days.

(21) Appl. No.: 12/037,573

(22) Filed: Feb. 26, 2008

(65) Prior Publication Data

US 2008/0222372 A1   Sep. 11, 2008

Related U.S. Application Data

(60) Provisional application No. 60/893,274, filed on Mar. 6, 2007.

(51) Int. Cl.
*H04L 12/28* (2006.01)

(52) U.S. Cl.
USPC .............................. 370/412; 711/5

(58) Field of Classification Search
USPC .............................. 370/412; 711/5
See application file for complete search history.

(56) References Cited

U.S. PATENT DOCUMENTS

| | | | |
|---|---|---|---|
| 2002/0169921 A1* | 11/2002 | Saitoh | 711/5 |
| 2006/0048035 A1* | 3/2006 | Dominique et al. | 714/755 |
| 2006/0068714 A1* | 3/2006 | Sharma et al. | 455/67.11 |
| 2006/0282712 A1 | 12/2006 | Argon et al. | |
| 2007/0171979 A1* | 7/2007 | Eerenberg et al. | 375/240.24 |

OTHER PUBLICATIONS

Bahl et al., "Optimal decoding of linear codes for minimizing symbol error rate," IEE Trans. Inform. Theory vol. IT-20, pp. 284-287, 1974.
Berrou et al., "Near Shannon limit error-correcting coding: Turbo codes," in Proc. IEEE Int. Conf. Commun., Geneva, Switzerland, 1993, pp. 1064-1070.
C. Shannon "A mathematical theory of communication", Bell System Telephone Journal, vol. 27, Jul. and Oct. 1948, pt. 1, pp. 379-423; pt 11, pp. 623-656.
M.C. Valenti, "Turbo codes and iterative processing," in Proc. IEEE New Zealand Wireless Commun. Symp, '98, Auckland, New Zealand, Nov. 1998.
Office Action from the Israel Patent Office dated Apr. 4, 2011 for Israel Patent Application No. 189848.

* cited by examiner

*Primary Examiner* — Wei Zhao (57) ABSTRACT

A turbo decoder has at least two Bahl, Cocke, Jelinek, and Raviv (BCJR) processors in parallel, each in serial communication with respective interleavers. The BCJR processors and interleavers are in communication with a memory module that is internally split into non-overlapping memory banks. The turbo decoder includes respective sorter circuits in communication with the output of each BCJR processor/interleaver. A sorter circuit receives a data block from a BCJR processor/interleaver and directs the data block to the memory bank designated by an address assigned to the data block by an interleaver.

18 Claims, 10 Drawing Sheets

TURBO DECODER

RELATED APPLICATION

This application claims the benefit of U.S. Provisional Application No. 60/893,274, filed on Mar. 6, 2007, which is incorporated herein by reference.

BACKGROUND

1. Technical Field

The present disclosure relates to the field of high-speed downlink packet access, and more particularly to increasing the throughput of a memory in a turbo decoder at a receiving device.

2. Related Art

Turbo coding is a high-performance coding scheme. Each data bit to be communicated ("subject data bit") is represented by a group of control bits, such as error correction bits. The group of control bits are determined using a recursive systematic convolutional code applied to the subject data bit and a predetermined number of adjacent data bits. An interleaver interleaves two or more groups of control bits into a data block prior to transmission so that if an error burst occurs (an error burst is a contiguous sequence of errors that are not correctable by most lower-performance coding (data recovery) schemes), it will be scattered among the several groups of control bits. At the receiving device, a turbo decoder recovers the correct data by iteratively de-interleaving and decoding the data block.

High-speed downlink packet access (HSDPA) is one communications protocol that allows networks to have higher data transfer speeds and capacity and may implement turbo coding to maximize information transfer in the presence of data-corrupting noise that may cause an error burst. Turbo coding may also be implemented in other high performance communication protocols, such as Orthogonal Frequency Division Multiple Access (OFDMA), Long Term Evolution (LTE), Enhanced Data rates for GSM Evolution (EDGE), Enhanced GPRS (EGPRS), and the like.

A turbo decoder includes a memory (random access memory) in communication with a decoding processor and an interleaver. Processed data blocks are temporarily stored in the memory after each iteration. The data blocks are iteratively processed through the processor, the interleaver, and the memory until a parameter referred to as the logarithm of likelihood ratio (LLR) indicates a high-probability that the subject data bit is either a "0" or "1". Each iteration through the turbo decoder includes two sub-iterations. The first sub-iteration is referred to as the systematic iteration, where the processor processes the data block, and the second sub-iteration is referred to as the interleaved iteration, where the interleaver assigns a respective memory address to each data block so that data can be read linearly from the memory for the subsequent systematic iteration.

Conventionally, the processing speed of the memory must be sufficiently faster than that of the decoding processor. For example, if a turbo decoder includes two decoding processors operating in parallel, and each processor processes at X MHz, the memory must process at least at 2X MHz so that the processed data blocks can be written to and read out of the memory fast enough to support the parallel processing demand. The performance of a turbo decoder may not be increased simply by increasing the processing speed of the processors.

BRIEF SUMMARY

The following embodiments relate to a turbo decoder that processes data blocks in parallel and writes the data blocks to assigned address spaces in a memory. The memory may be a RAM, SRAM, DRAM, register file, or other type of data storage device such as a flip-flop or data latch array (hereinafter referred to in general as "memory"). Collisions (overlapping address signaling when writing two or more data blocks to the memory at the same time) are prevented by sorter circuits that sort the data blocks to exclusive areas of memory. Each sorter circuit includes a respective queue for use in writing the data blocks to its memory area in turn.

The turbo decoder may include at least two processors operating in parallel, each executing a decoding algorithm, such as the Bahl, Cocke, Jelinek, and Raviv (BCJR) algorithm, to recover the data. The turbo decoder may also include at least two interleavers/deinterleavers (hereinafter "interleaver"), each in series with its respective BCJR processor, to write the processed data blocks to memory in a de-interleaving order so that the data blocks can be linearly read out of the memory for the next systematic decoding iteration. It is noted that a turbo decoder may implement three, four or more BCJR processors and their respective interleavers in parallel to execute the decoding iterations.

A sorter circuit receives a data block from an interleaver and communicates the data block to the queue that is in communication with the exclusive area of memory that includes the address assigned to the data block by the interleaver. Routers read the data blocks and addresses from the queues in turn and write the data blocks to the assigned addresses. Each router is in communication only with its own respective exclusive area of memory (sometimes referred to as a "memory bank").

According to one embodiment of the invention, a method comprises receiving a first data block from a first decoder and a second data block from a second decoder. The first data block is associated with a first memory address from within a memory bank. The memory bank is among a plurality of non-overlapping memory banks in a memory. The first data block is communicated to a first buffer within a plurality of buffers, and the second data block is communicated to a second buffer within the plurality of buffers. The method includes selecting, according to a priority, either the first data block or the second data block from the plurality of buffers and communicating the selected data block to the memory bank. The method may also include one or more of the following acts: decoding the first and second data blocks by iteratively processing the first and second data blocks through systematic iterations and interleaver iterations; reading the selected data block from the memory bank; processing the selected data block through a systematic iteration; and processing the selected data block with parity data to update a logarithm of likelihood ratio (LLR), wherein the LLR indicates a probability of a status of a bit as either a zero or a one. Processing the selected data block through a systematic iteration may include processing the encoded data block according to the Bahl, Cocke, Jelinek, and Raviv (BCJR) algorithm, as an example.

According to another embodiment, a wireless receiver comprises a plurality of decoder circuits, including a first decoder circuit and a second decoder circuit. The decoder circuits are operative to decode encoded data blocks that are received by the wireless receiver. The wireless receiver also includes a plurality of non-overlapping memory banks, wherein each memory bank is in communication with each decoder circuit of the plurality of decoder circuits. The wireless receiver includes a routing circuit configured to selectively communicate data that is decoded by the first decoder circuit to either one of a first memory bank and a second memory bank among the plurality of non-overlapping memory banks. The routing circuit also selectively communicates data, decoded by the second decoder circuit, to either the first memory bank or the second memory bank.

The routing circuit may also be configured to assign data to the first memory bank according to a sequence, wherein the data block includes data received from the first decoder circuit and the second decoder circuit. The routing circuit may also assign data to the second memory bank according to a sequence, wherein the data includes data received from the first decoder circuit and the second decoder circuit. The routing circuit may include a first plurality of buffers in communication with the first memory bank, and a second plurality of buffers in communication with the second memory bank.

The wireless receiver may also include a sorting circuit in communication with the plurality of decoder circuits and with a first buffer in the first plurality of buffers and with a second buffer in the second plurality of buffers. The sorting circuit may be operative to selectably communicate a data block to either the first buffer or the second buffer.

The routing circuit may also include a first router in communication with the first plurality of buffers to de-queue data in the first plurality of buffers according to a priority, and communicate data de-queued from the first plurality of buffers to the first memory bank. The routing circuit may include a second router in communication with the second plurality of buffers to de-queue data in the second plurality of buffers according to a priority, and communicate data de-queued from the second plurality of buffers to the second memory bank. The decoder circuit may be configured to decode systematic bits in a signal received by the wireless receiver. The wireless receiver may be embodied in a first electronic device that is in wireless communication with a second electronic device. The first electronic device may be a cellular telephone in communication with a cellular network, as an example.

According to another embodiment, an apparatus is comprised of one or more of the following: means for receiving a first data block from a first decoder and a second data block from a second decoder; means for communicating the first data block to a first buffer within a plurality of buffers, and for communicating the second data block to a second buffer within the plurality of buffers; means for selecting, according to a priority, either the first data block or the second data block from the plurality of buffers and communicating the selected data block to a memory bank; means for decoding the first and second data blocks by iteratively processing the first and second data blocks through systematic iterations and interleaver iterations; means for writing the selected data block to the memory bank; means for reading the selected data block from the memory bank; means for processing the selected data block through a systematic iteration; and means for processing the selected data block with parity data to update a logarithm of likelihood ratio (LLR), wherein the LLR indicates a probability of a status of a bit as either a zero or a one. Processing the selected data block through a systematic iteration may include processing the selected data block according to the Bahl, Cocke, Jelinek, and Raviv (BCJR) algorithm.

According to yet another embodiment, a computer readable storage medium has processor executable instructions to execute one or more of the following acts: receive a first data block from a first decoder and a second data block from a second decoder; communicate the first data block to a first buffer within a plurality of buffers; communicate the second data block to a second buffer within the plurality of buffers; select, according to a priority, either the first data block or the second data block from the plurality of buffers and communicate the selected data block to a memory bank; decode the first and second data blocks by iteratively processing the first and second data blocks through systematic iterations and interleaver iterations; write the selected data block to the memory bank; read the selected data block from the memory bank; process the selected data block through a systematic iteration; and process the selected data block with parity data to update a logarithm of likelihood ratio (LLR), wherein the LLR indicates a probability of a status of a bit as either a zero or a one. Processing the selected data block through a systematic iteration may include processing the selected data block according to the Bahl, Cocke, Jelinek, and Raviv (BCJR) algorithm.

According to another embodiment of the invention, a method comprises one or more of the following acts: assigning to a first data block of encoded data an address within one of a plurality of non-overlapping memory banks, wherein each memory bank is internal to a single memory module; sorting the first data block to a queue in communication with the one of the plurality of memory banks; reading the first data block from the queue and writing the first data block to the one of the plurality of memory banks; reading the first data block from the one of the plurality of memory banks and systematically processing the first data block to update a parameter indicative of a status of a bit as either a zero or a one; receiving an encoded data block and dividing the encoded data block into a plurality of data blocks, including the first data block and a second data block; systematically processing, in parallel, the first data block and the second data block; processing the first data block with first parity data and processing the second data block with second parity data; representing a data bit by a first group of control bits, and interleaving the first group of control bits with at least a second group of control bits to provide the first data block. The first and second data blocks may be systematically processed by first and second processors, respectively, both operating at approximately a maximum operating speed of the memory module. The parameter may be a logarithm of likelihood ratio.

According to another embodiment of the invention an apparatus has an interleaver to assign to a first data block of encoded data an address within one of a plurality of non-overlapping memory banks. Each memory bank may be internal to a single memory module. The apparatus also has a sorter to sort the first data block to a queue in communication with the one of the plurality of memory banks, and a router to read the first data block from the queue and communicate the first data block to the one of the plurality of memory banks. The apparatus may include a processor to receive the first data block from the one of the plurality of memory banks and systematically process the first data block to update a parameter indicative of a status of a bit as either a zero or a one. The parameter may be a logarithm of likelihood ratio, as an example. The apparatus may also have a processor to receive an encoded data block and divide the encoded data block into a plurality of data blocks, including the first data block and a second data block. The apparatus may also have a plurality of decoding processors to process, in parallel, the first data block and the second data block through a systematic iteration. The plurality of decoding processors may each operate at more than one-half of a maximum operating speed of the memory module. The apparatus may have a processor to represent a data bit by a first group of control bits, and interleave the first group of control bits with at least a second group of control bits to provide the first data block of encoded data.

According to another embodiment, an apparatus is comprised of one or more of the following: means for assigning to a first data block of encoded data an address within one of a plurality of memory banks, wherein each memory bank is internal to a single memory module; means for sorting the first data block to a queue in communication with the one of the plurality of memory banks; means for reading the first data block from the queue and writing the first data block to the one of the plurality of memory banks; means for reading the first data block from the one of the plurality of memory banks and systematically processing the first data block to update a parameter indicative of a status of a bit as either a zero or a one; means for receiving an encoded data block and dividing the encoded data block into a plurality of data blocks, including the first data block and a second data block; means for systematically processing, in parallel, the first data block and the second data block; means for processing the first data block with first parity data and processing the second data block with second parity data; means for representing a data bit by a first group of control bits, and interleaving the first group of control bits with at least a second group of control bits to provide the first data block. The first and second data blocks may be systematically processed by first and second processors, respectively, both operating at approximately a maximum operating speed of the memory module. The parameter may be a logarithm of likelihood ratio.

According to yet another embodiment, a computer readable storage medium may have processor executable instructions to execute one or more of the following acts: assign to a first data block of encoded data an address within one of a plurality of memory banks, wherein each memory bank is internal to a single memory module; sort the first data block to a queue in communication with the one of the plurality of memory banks; read the first data block from the queue and write the first data block to the one of the plurality of memory banks; read the first data block from the one of the plurality of memory banks and systematically process the first data block to update a parameter indicative of a status of a bit as either a zero or a one; receive an encoded data block and divide the encoded data block into a plurality of data blocks, including the first data block and a second data block; systematically process, in parallel, the first data block and the second data block; process the first data block with first parity data and process the second data block with second parity data; represent a data bit by a first group of control bits, and interleave the first group of control bits with at least a second group of control bits to provide the first data block. The first and second data blocks may be systematically processed by first and second processors, respectively, both operating at approximately a maximum operating speed of the memory module. The parameter may be a logarithm of likelihood ratio.

Other systems, methods, and features of the invention will be, or will become, apparent to one with skill in the art upon examination of the following figures and detailed description. It is intended that all such additional systems, methods, features and advantages be included within this description, be within the scope of the invention, and be protected by the following claims.

The preferred embodiments will now be described with reference to the attached drawings.

DETAILED DESCRIPTION

The disclosure can be better understood with reference to the following drawings and description. The components in the figures are not necessarily to scale, emphasis instead being placed upon illustrating the principles of the invention. Moreover, in the figures, like referenced numerals designate corresponding parts or elements throughout the different views.

The embodiments below relate to a turbo decoder having at least two BCJR processors in parallel, each in serial communication with a respective interleaver. The at least two BCJR processors (and their corresponding interleavers) are both in communication with non-overlapping (exclusive) banks of a single random access memory (RAM) module. In an embodiment, the RAM is internally split into as many banks as there are BCJR processors. Each bank serves a BCJR processor and associated interleaver. Because the RAM is split into as many exclusive banks as there are BCJR processors, the speed of the BCJR processors can be as fast as the speed of the RAM. In other words, if the maximum speed of the RAM is 2X MHz, each BCJR processor may process data at 2X MHz, effectively doubling the speed of the turbo decoder without having to incorporate a faster or additional RAM module.

The turbo decoder includes respective sorter circuits in communication with the output of each BCJR processor/interleaver. A sorter circuit receives, for example, a data block from a BCJR processor/interleaver and directs the data block to the RAM bank designated by an address assigned to the data block by the interleaver. The sorter circuit includes a sorter for receiving the data block and address and communicating the data block and address to a designated queue that is in communication with the RAM bank having the assigned address. A router reads the data block and address from the queue and communicates the data block and address to the RAM bank having the address. The sorter circuit(s) avoid RAM collisions in the event that two or more parallel interleavers assign addresses that are within the same data bank to two or more different data blocks, at the same time. Thus, a single RAM module may be implemented to temporarily store data blocks that are processed by BCJR processors operating at the same processing speed as the RAM module.

Throughout the specification, for clarity of explanation a turbo decoder having two BCJR processors will be described. However, it is to be understood that a turbo decoder having three, four, or more BCJR processors/interleavers in parallel will function in the same general manner as a turbo decoder having two BCJR processors; all are considered within the scope of the invention. Also, the turbo decoder processor will be referred to as the "BCJR processor" throughout the specification. However, it is to be understood that the processor may execute any other algorithm or algorithms that decode error correction code or otherwise process encoded data.

Figure 1:
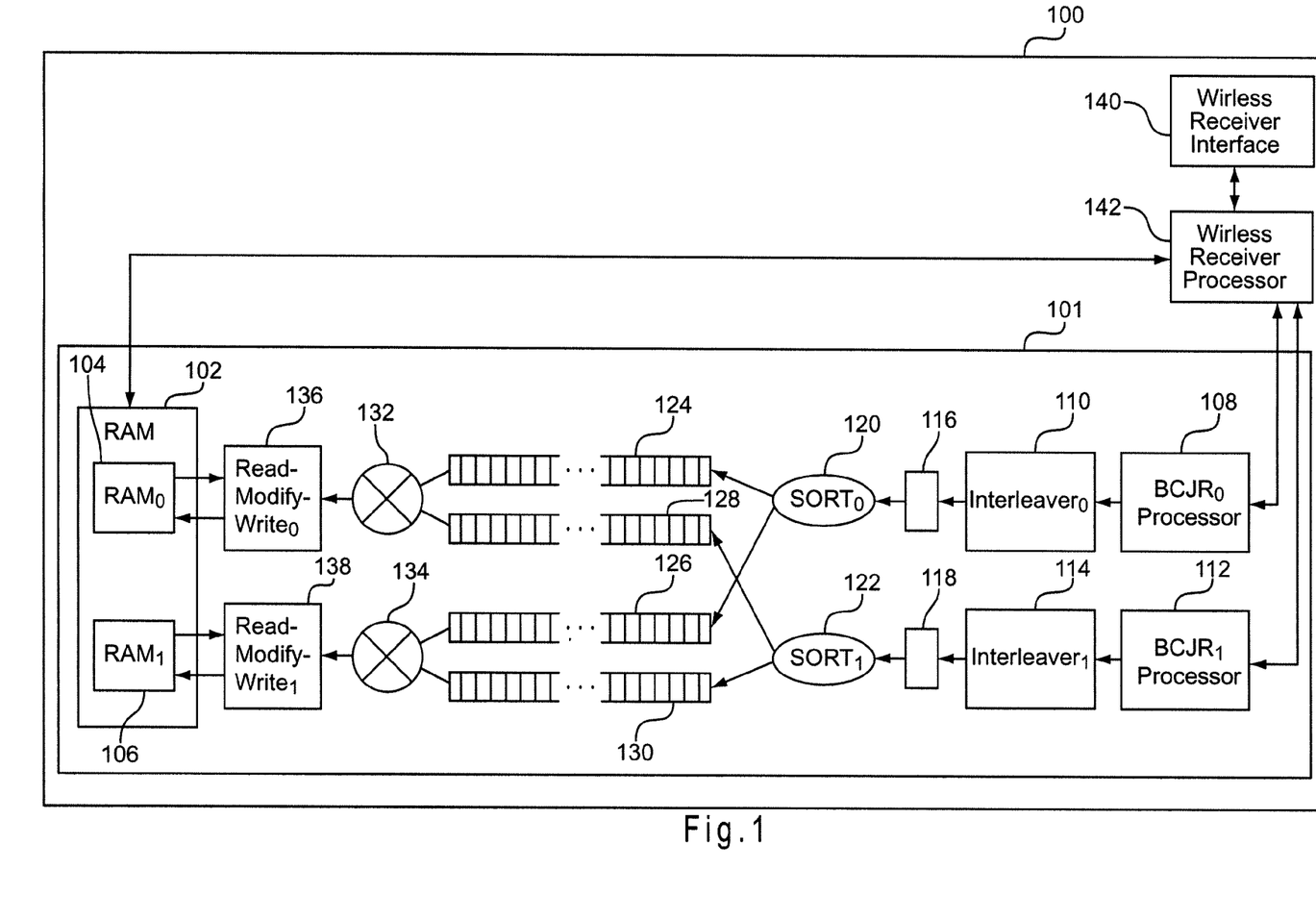
FIG. 1 is a block diagram showing components of a wireless receiver having an embodiment of a turbo decoder of the present invention.

FIG. 1 is a block diagram showing components of an embodiment of a wireless receiver 100 having a turbo decoder 101 that processes a data block through an interleaved iteration. The data block may be communicated to the wireless receiver 100 by way of a wireless communication network such as a cellular or local area network, as examples, and received by a wireless receiver interface 140. The data block includes data that indicates the probability of whether a subject data bit is either a "0" or a "1". The data may be a LLR parameter to indicate the probability, as an example. Alternatively, the data may represent any other measure of probability or identification of the subject data bit.

The turbo decoder 100 has a memory module 102 that is internally split into two memory banks. The memory module 102 may be a static random access memory (SRAM) module, dynamic random access memory (DRAM) module, or any other type of RAM module. In alternate embodiments the memory module 102 may be a register file, or other type of data storage device such as a flip-flop or data latch array having separate memory banks.

In the illustrated embodiment the memory module 102 is a RAM module that is internally split into two RAM banks, referred to as $RAM_0$ 104 and $RAM_1$ 106. The RAM banks serve two parallel BCJR processors, $BCJR_0$ 108 and $BCJR_1$ 112 that are in series with respective interleavers, $interleaver_0$ 110 and $interleaver_1$ 114. The addresses of the RAM banks are non-overlapping (otherwise referred to as "exclusive" to one another) so that data may be read from and written to both banks at the same time without the possibility of a collision. The dual ram banks and the parallel processors and interleavers provide for faster decoding of a block of data received from the wireless receiver interface 140. In this regard, an encoded data block received by the wireless receiver interface 140 may be divided in half by a wireless receiver processor 142. The wireless receiver processor 142 communicates one of the divided data blocks to $RAM_0$ 104 and the other divided data block to $RAM_1$ 106, as an example. Thereafter, the divided data blocks may be processed in parallel through systematic and interleaved iterations, as discussed below.

During an interleaved iteration, $interleaver_0$ 110 and $interleaver_1$ 114 each assign an address to its respective processed data block 116, 118. The address assigned to data block 116 may be in $RAM_0$ 104 or $RAM_1$ 106. Likewise, the address assigned to data block 118 may be in $RAM_0$ 104 or $RAM_1$ 106. Moreover, the assigned addresses may be within the same RAM bank, $RAM_0$ 104 or $RAM_1$ 106.

Each data block 116, 118 is communicated to a respective sorter circuit, $sort_0$ 120 or $sort_1$ 122. Each sorter circuit reads the address assigned to the respective data block 116, 118 and communicates the data block to a queue in communication with the data bank 104, 106 having the assigned address. If the address of data block 116 is within $RAM_0$ 104, $sort_0$ 120 communicates the data block 116 to a queue 124 in communication with $RAM_0$ 104. If the address of data block 116 is within $RAM_1$ 106, $sort_0$ 120 communicates the data block 116 to a queue 126 in communication with $RAM_1$ 106. Likewise, if the address of data block 118 is within $RAM_0$ 104, $sort_1$ 122 communicates the data block 118 to a queue 128 in communication with $RAM_0$ 104. If the address of data block 118 is within $RAM_1$ 106, $sort_1$ 122 communicates the data block 118 to a queue 130 in communication with $RAM_1$ 106. It is possible that the addresses assigned to the data blocks 116, 118 are within the same RAM bank. In that case, the data blocks 116, 118 are communicated to queues (e.g., queues 124 and 128, or queues 126 and 130) in communication with the same RAM bank. The queues 124, 126, 128, and 130 may be any type of suitable memory, such as a buffer memory for example.

Router 132 reads the data blocks from queues 124 and 128, and router 134 reads the data blocks from queues 126 and 130. Each router 132, 134 de-queues the data blocks from its respective queues by selectively reading from the queue having the greater number of data blocks. In other words, the routers 132 and 134 read from whichever queue (124 or 128 for router 132, or 126 or 130 for router 134) is more full. In one version, each queue 124, 126, 128, and 130 is a buffer having a queue depth of twenty, as an example. The routers 132, 134 communicate the data blocks to respective read-modify-write modules 136, 138 which write the data blocks to the assigned address spaces within either memory bank, $RAM_0$ 104 or $RAM_1$ 106. The data blocks may then be read linearly from their respective memory banks $RAM_0$ 104 or $RAM_1$ 106 for a subsequent systematic iteration (discussed below) for generating systematic bits.

As discussed above, each data block may be used to generate LLR data that indicates a probability that the corresponding (or "subject") data bit is a binary "0" or "1". The LLR data is determined from the data blocks by the wireless receiver processor 142. If after an iteration the probability is determined to be high that the bit is either "0" or "1", the iterative process may stop for the respective data block, and the status of the data bit communicated by the wireless receiver processor 142 to another module or other device (not shown) such as a data bit memory module.

Figure 2A:
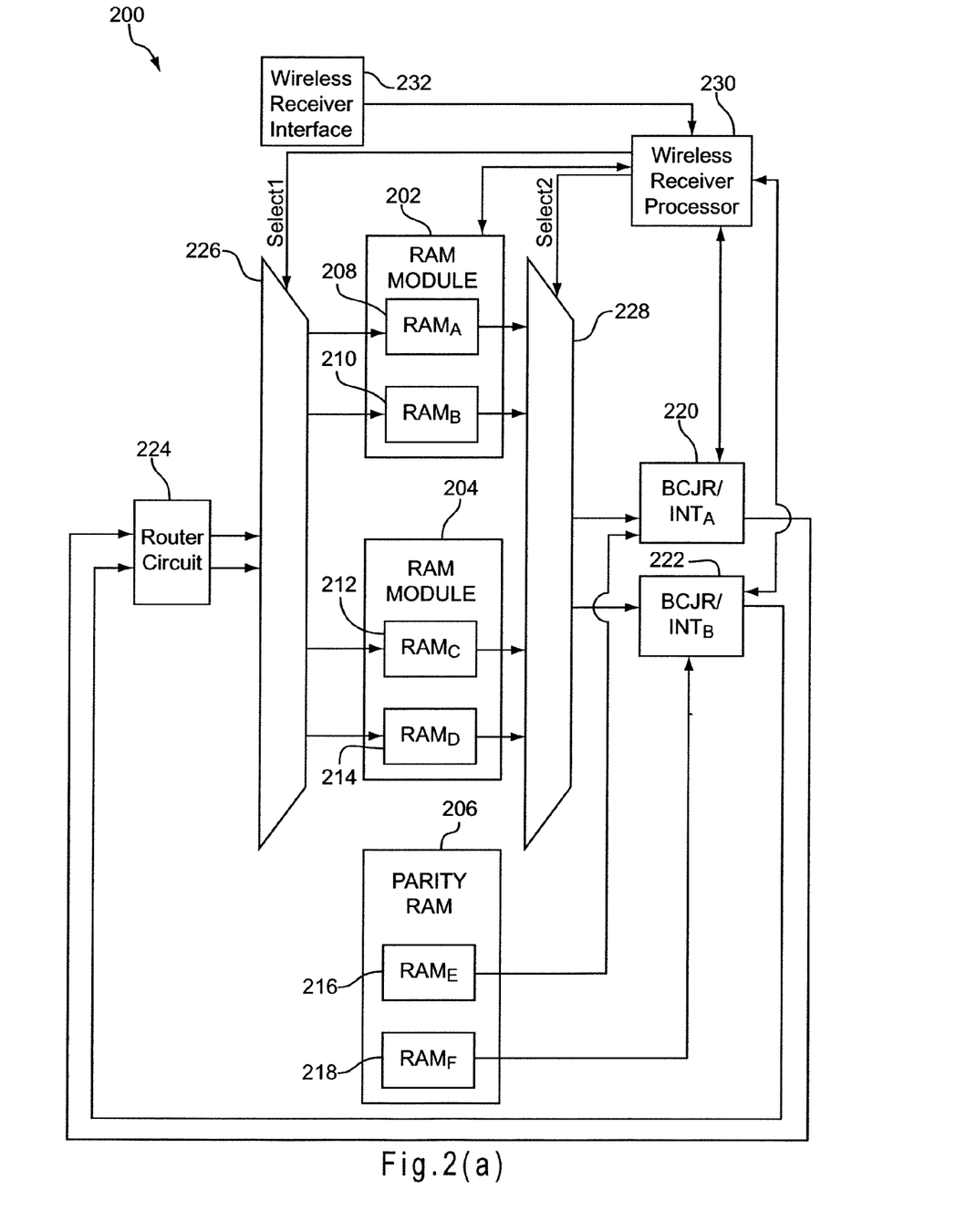
FIG. 2(a) is a block diagram showing additional components of the turbo decoder of FIG. 1.

FIG. 2(a) is a block diagram showing additional components of a turbo decoder 200 that processes two data blocks in parallel through systematic and interleaved iterations. RAM module 202 receives the data blocks after an interleaved iteration and temporarily stores the data blocks. The data blocks are read linearly from the memory at the start of a subsequent systematic iteration. RAM module 204 temporarily stores data blocks that result from systematic iterations; those data blocks are read from RAM module 204 at the start of an interleaved iteration.

For an interleaved iteration, a wireless receiver processor 230 controls a first multiplexer 226 (via a $select_1$ signal) to output data blocks received from a router circuit 224 to RAM module 202. The wireless receiver processor 230 controls a second multiplexer 228 (via a $select_2$ signal) to communicate the data blocks from RAM module 202 to two parallel BCJR processors and interleavers ($BCJR/INT_A$ and $BCJR/INT_B$) 220, 224 at the start of the subsequent systematic iteration. For a systematic iteration, the wireless receiver processor 230 controls the first multiplexer 226 to output data blocks received from the router circuit 224 to RAM module 204. The wireless receiver processor 230 controls the second multiplexer 228 to communicate the data blocks from RAM module 204 to $BCJR/INT_A$ 220 and $BCJR/INT_B$ 222 at the start of the subsequent interleaver iteration. A parity RAM 206 communicates parity data to $BCJR/INT_A$ 220 and $BCJR/INT_B$ 222 during both systematic and interleaved iterations, as discussed below.

A data block communicated to the turbo decoder 200 via a cellular network or other type of network is received by a wireless receiver interface 232. The wireless receiver interface 232 communicates the data block to the wireless receiver processor 230, which communicates the data block linearly to a $RAM_A$ bank 208. In a version, the data block may have 40 to 5114 bits comprising LLR data, as an example. If the data block has less than 320 bits, it is not split and is communicated the RAM$_A$ bank 208 and processed systematically. If the data block has 320 or more bits, it is split into two data blocks, each within a respective memory bank, RAM$_A$ 208 and RAM$_B$ 210. The split data blocks are communicated to respective BCJR processor and interleavers BCJR/INT$_A$ 220 and BCJR/INT$_B$ 222 and processed in parallel through a systematic iteration.

Figure 2B:
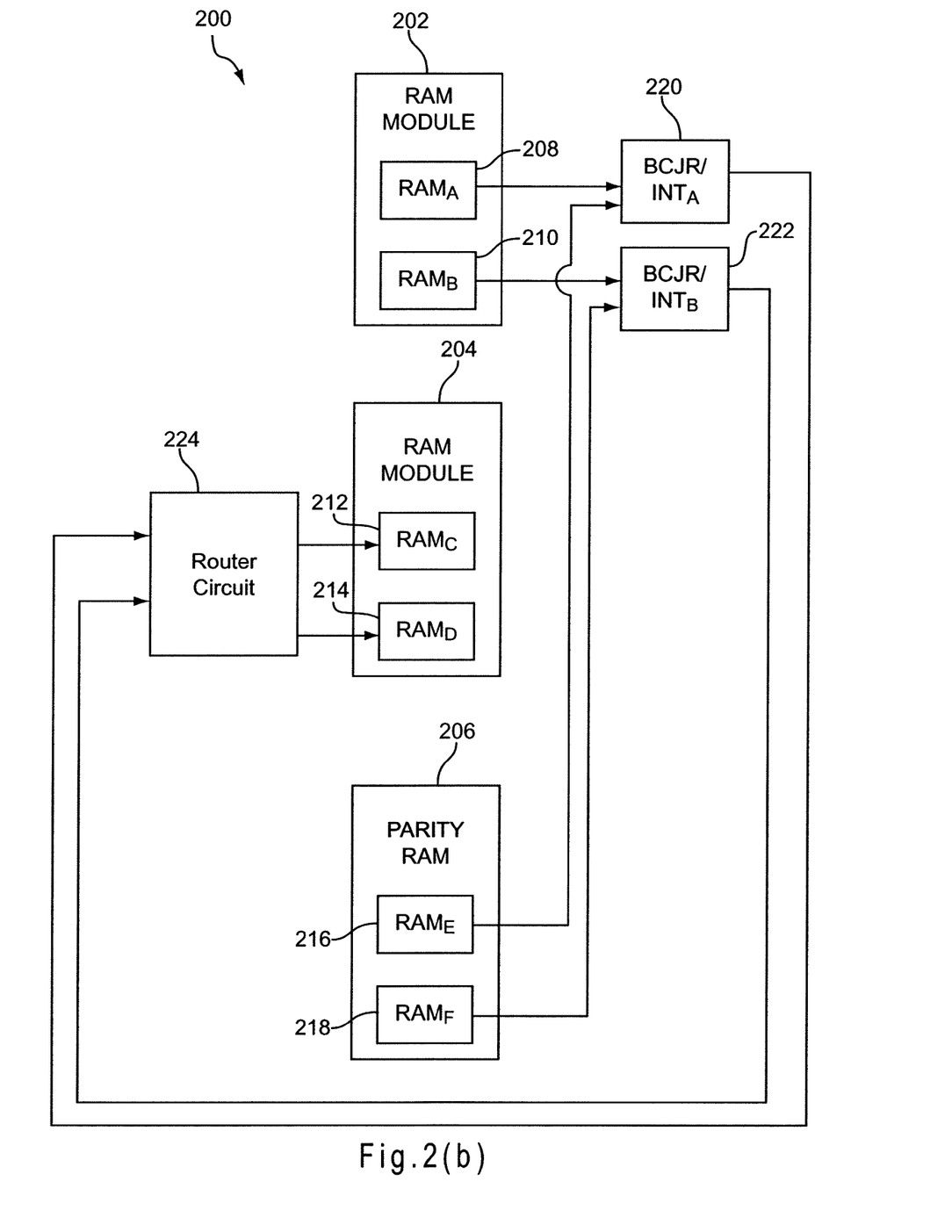
FIGS. 2(b) and 2(c) show data paths for systematic and interleaved iterations, respectively, of the turbo decoder of FIG. 2(a)

FIG. 2(b) shows a data path for a systematic iteration of the turbo decoder 200 of FIG. 2(a). BCJR/INT$_A$ 220 and BCJR/INT$_B$ 222 each receive parity data from a parity RAM 206 having two parity RAM banks RAM$_E$ 216 and RAM$_F$ 218. Each parity RAM bank has stored therein parity data for use by BCJR/INT$_A$ 220 and BCJR/INT$_B$ 222 to generate systematic bits for each received data block, respectively. The data blocks are updated by summing a change ($\Delta$) to the data block LLR (i.e., the output of the BCJR processors are data blocks representing LLR+$\Delta$LLR). The wireless receiver processor 230 determines whether an updated LLR indicates to a high probability whether the subject data bit is a "0" or a "1". If so, the iterative process (systematic and interleaved iterations) ends for that data block and the status of the subject bit is communicated from the wireless receiver processor 230 to a data bit memory module (not shown) or other device. If the LLR data does not indicate to a high probability whether the subject data bit is a "0" or "1", the processed data blocks are communicated to the router circuit 224 and to respective ram banks RAM$_C$ 212 and RAM$_D$ 214 in RAM module 204. The updated data blocks are read from RAM module 204 for the subsequent interleaved iteration.

Figure 2C:
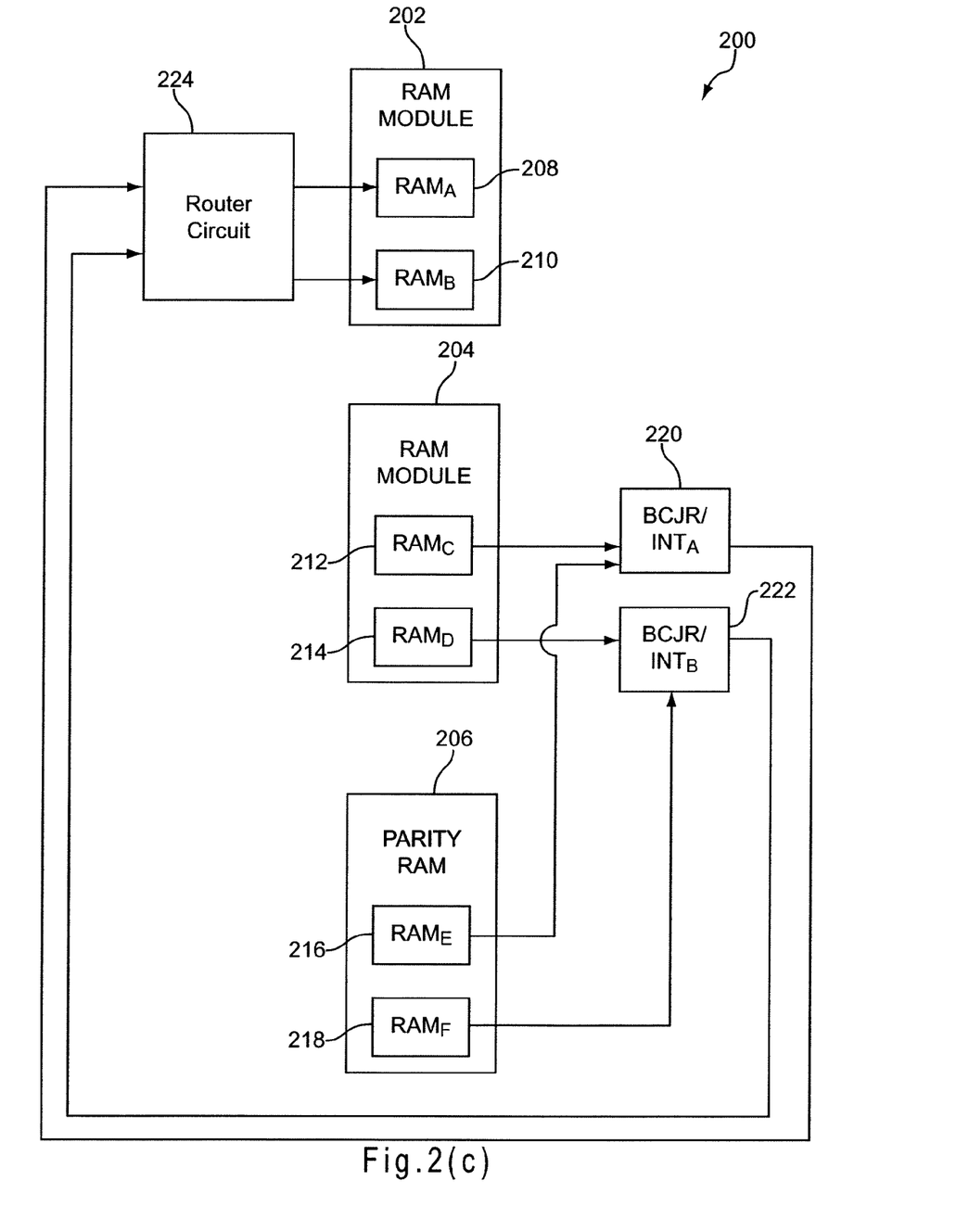

FIG. 2(c) illustrates an interleaved iteration of the turbo decoder of FIG. 2(a). During an interleaved iteration, BCJR/INT$_A$ 220 and BCJR/INT$_B$ 222 each receive parity data from a respective bank in the parity RAM 206. BCJR/INT$_A$ 220 and BCJR/INT$_B$ 222 apply the parity data to the respective data blocks received from the respective RAM banks 212, 214 to assign an address within RAM module 202 to each updated data block. As discussed above, the assigned addresses for each data block may be in either RAM$_A$ 208 or RAM$_B$ 210. The assigned addresses are determined by the respective interleavers according to interleaver protocol so that the updated data blocks may be read linearly from RAM module 202 for the subsequent systematic iteration. The router circuit 224 includes sort, queue, router, and read-modify-write components, such as those shown in FIG. 1 for example, for writing the updated data block to the correct RAM bank in RAM module 202.

Figure 3:
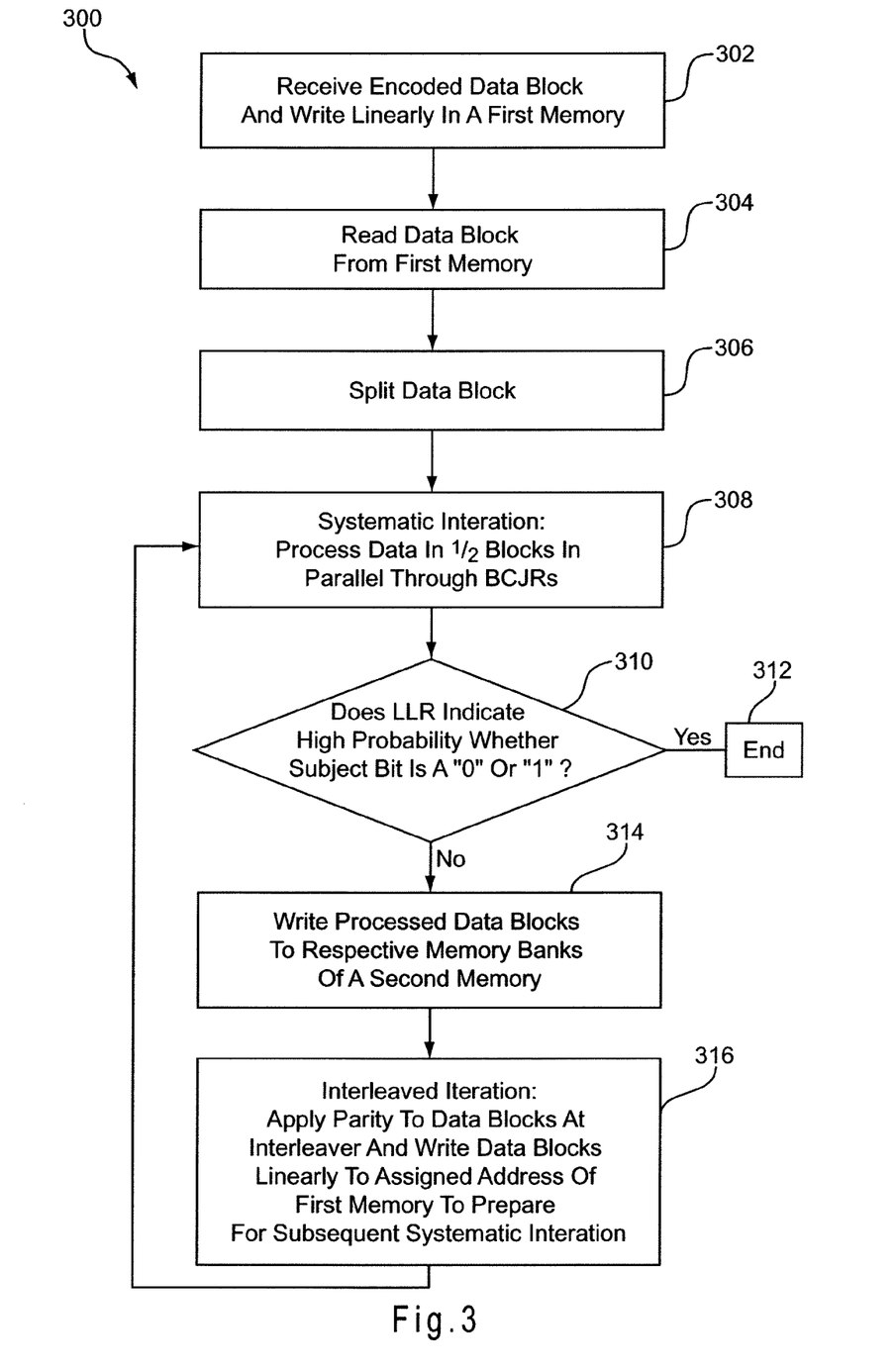
FIG. 3 shows acts for determining the value of a data bit from an encoded data block, in accord with an embodiment of the invention.

FIG. 3 shows acts 300 that may be executed by a turbo decoder having first and second memory modules that are each internally split into as many banks as there are BCJR processors operating in parallel, for example. The turbo decoder receives an encoded data block from a wireless receiver processor that writes the data block linearly to a data bank in a first memory module (302). In a version, the data block may have 40 to 5114 bits comprising LLR data, as an example. The data block is read from the first memory module (304). If the data block has less than 320 bits, it is not split and is communicated to a BCJR processor and processed systematically. If the data block has 320 or more bits, it is split into two data blocks (306). The split data blocks are processed in parallel through a systematic iteration (i.e., through the application of parity data to each data block to generate systematic bits) executed by two BCJR processors operating in parallel (308). If an LLR indicates a high probability that the subject data bit is a "0" or a "1", the iterative process (systematic and interleaved iterations) ends (312). If the LLR does not indicate a high probability that the subject data bit is a "0" or "1", the processed data blocks are written to respective memory banks of a second memory (314). Each memory bank in the second memory receives a respective data block from its respective BCJR processor. The data blocks are read from the second memory module and processed in parallel through an interleaved iteration (316). Parity data is applied to the data blocks at an interleaver that assigns an address of the first memory module to each data block. The data blocks are each written to respective assigned addresses of the first memory module. The assigned address for each data block may be in either data bank of the first memory module. The data blocks are stored linearly in the first memory module in preparation to be read by the BCJR processors executing a subsequent systematic iteration (return to 308).

Figure 4A:
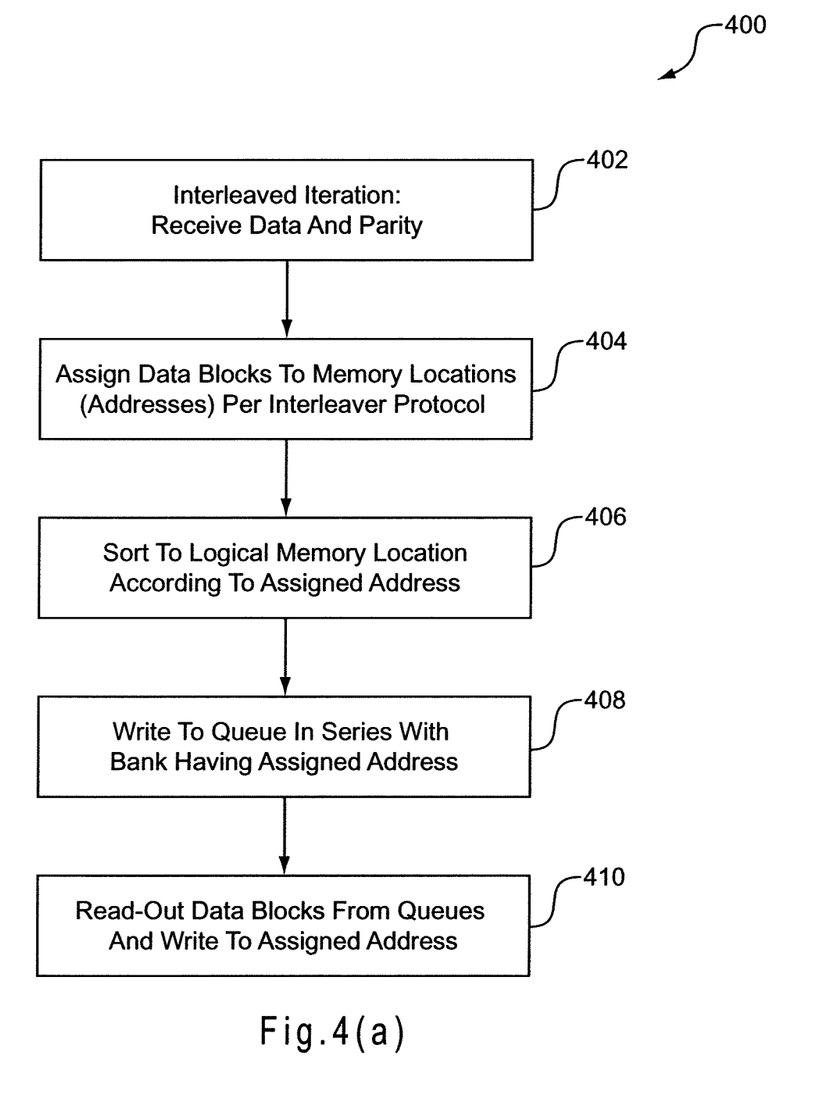
FIG. 4(a) shows acts for executing an interleaved iteration for determining the value of a data bit from an encoded data block, in accord with an embodiment of the invention.

FIG. 4(a) shows acts 400 for executing an interleaved iteration in a turbo decoder. At least two data blocks are received from respective banks of a first memory, and at least two sets of parity data are received from a second memory (402). The parity data is applied to the data blocks to assign memory locations of a third memory to each data block, according to interleaver protocol (404). Each data block is sorted to a bank of the third memory based on the assigned address (406). The data blocks are written to the queue(s) that are in series with the memory bank(s) having the assigned addresses (408). The data blocks are read out from the queues and written to the assigned addresses in the third memory (410). It is noted that the data blocks do not necessarily have to be read from the queues in the same order as they were output from the BCJR processors. The order is inconsequential because a subsequent iteration will start only after all the data is read from the queues and the queues are empty.

Figure 4B:
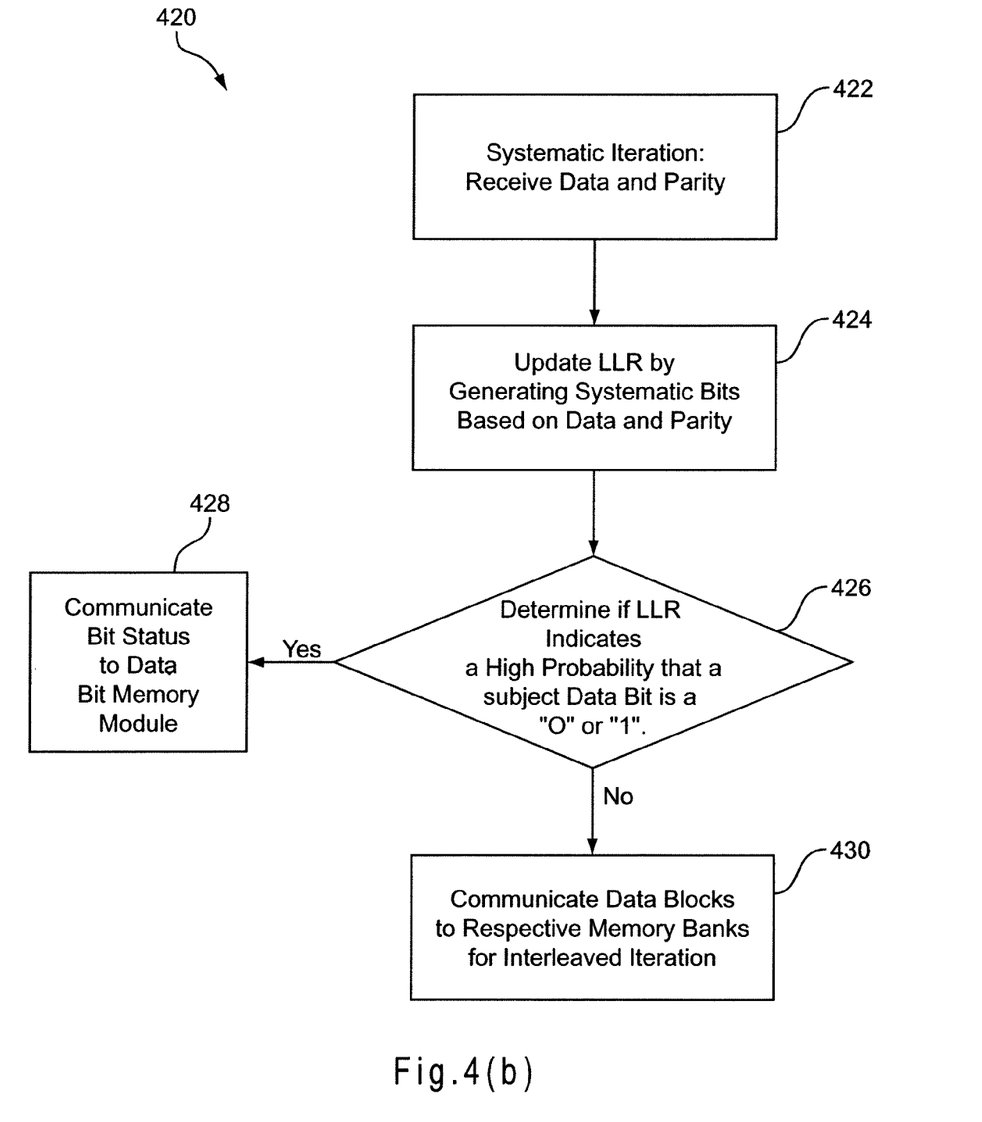
FIG. 4(b) shows acts for executing a systematic iteration for determining the value of a data bit from an encoded data block, in accord with an embodiment of the invention.

FIG. 4(b) shows acts 420 for executing a systematic iteration in a turbo decoder. At least two data blocks are received from respective banks of a first memory, and two sets of parity data are received from a second memory (422). The parity data is applied to the data blocks to generate systematic bits and to update the LLR data for each data block (Act 424). If the LLR data indicates, to a high probability, the value of a subject data bit (Act 426), the bit status is communicated to a data bit memory module (Act 428) or other device. If the LLR data does not indicate the value of a subject data bit to a high probability (Act 426), the updated data blocks are communicated to respective memory banks in preparation for the subsequent interleaved iteration (Act 430).

The turbo decoder of the present invention may be implemented in any type of device that receives data signals by way of a wired and/or wireless communication medium. FIGS. 5(a) to 5(f) show various examples of devices that may implement the turbo decoder. Each device, as shown, includes a WLAN and/or Wi-Fi interface for receiving data signals via a wireless medium. It is to be understood that the WLAN and Wi-Fi interfaces shown may be supplemented with or replaced by an interface that connects to a hardwired communication medium. In each example below, the turbo decoder of the present invention may decode data received by way of wired and/or wireless communication channels.

Figure 5A:
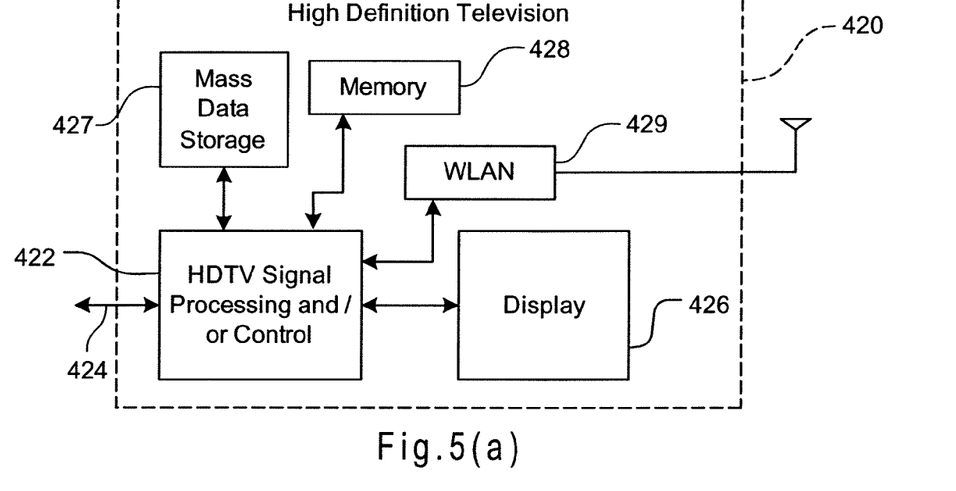
FIG. 5(a) is a functional block diagram of a high definition television.

Referring to FIG. 5(a), an embodiment of a turbo decoder (not shown) of the present invention may be implemented in a high definition television (HDTV) 420 to decode encoded data blocks received from a satellite network, a cellular/mobile network, a local area network, or other source. The turbo decoder of the present invention may be implemented in a signal processing and/or control circuit 422 or WLAN interface 429, as examples. HDTV 420 may receive HDTV input signals in either a wired or wireless format via one or more wired or wireless communication links 424. The HDTV input signals may include encoded data blocks that are decoded by the turbo decoder. The decoded data may include HDTV output signals that are communicated to a display 426. In some implementations, signal processing and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. HDTV 420 may include at least one hard disk drive ("HDD") and/or at least one digital versatile disk ("DVD") drive. The HDD may be a mini HDD that includes one or more platters having a diameter that is smaller than approximately 1.8". HDTV 420 may be connected to memory 428 such as RAM, ROM, low latency nonvolatile memory such as flash memory, and/or other suitable electronic data storage.

Referring now to FIG. 5(*b*), an embodiment of a turbo decoder (not shown) of the present invention may be implemented in a control system of a vehicle 430 for processing encoded data blocks. The encoded data blocks may be received by a WLAN interface 448, as an example. The vehicle 430 control system may include mass data storage 446 and/or a power-train control system 432 that receives inputs from one or more sensors 436 such as temperature sensors, pressure sensors, rotational sensors, airflow sensors and/or any other suitable sensors and/or that generates one or more output control signals such as engine operating parameters, transmission operating parameters, and/or other control signals at one or more output(s) 438.

Figure 5B:
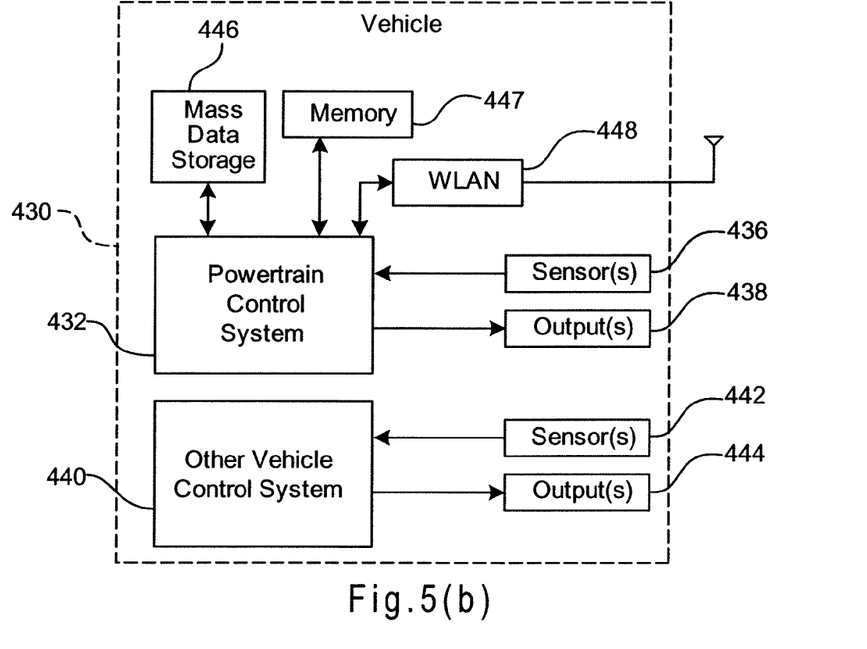
FIG. 5(b) is a functional block diagram of a vehicle control system.

The vehicle 430 may include a control system 440 that receives signals from input sensors 442 and/or outputs control signals to one or more output(s) 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD player, compact disc player, and the like. Still other implementations are contemplated.

Powertrain control system 432 may communicate with mass data storage 446 that stores data in a nonvolatile manner. Mass data storage 446 may include optical and/or magnetic storage devices, for example HDDs and/or DVD drives. The vehicle 430 may have at least one HDD and/or at least one DVD drive. The HDD may be a mini HDD that includes one or more platters having a diameter that is smaller than approximately 1.8". Powertrain control system 432 may be connected to a memory 447 such as RAM, ROM, low latency nonvolatile memory such as flash memory, and/or other suitable electronic data storage. Powertrain control system 432 also may support connections with a WLAN via the WLAN interface 448. The control system 440 may also include mass data storage, memory, and/or a WLAN interface (all not shown). A turbo decoder may be implemented in the powertrain control system 432, other vehicle control system 440, and/or the WLAN interface 448, as examples, to process data blocks received from a satellite network, a cellular/mobile network, a local area network, or other source.

Referring now to FIG. 5(*c*), an embodiment of the turbo decoder (not shown) of the present invention may be implemented in a cellular phone 450 that may include a cellular antenna 451. The turbo decoder may process encoded data blocks received by a signal processing and/or control circuit 452 and/or by a WLAN interface 468, as examples. The signal processing and/or control circuit 452 may receive data signals from a cellular/mobile network via the cellular antenna 451. The cellular phone 450 may include mass data storage 464. In some implementations, the cellular phone 450 includes a microphone 456, an audio output 458 such as a speaker and/or audio output jack, a display 460 and/or an input device 462 such as a keypad, pointing device, voice actuation and/or other input device. Signal processing and/or control circuit 452 and/or other circuits (not shown) in the cellular phone 450 may process data, perform coding and/or encryption, perform calculations, format data and/or perform other cellular phone functions.

Figure 5C:
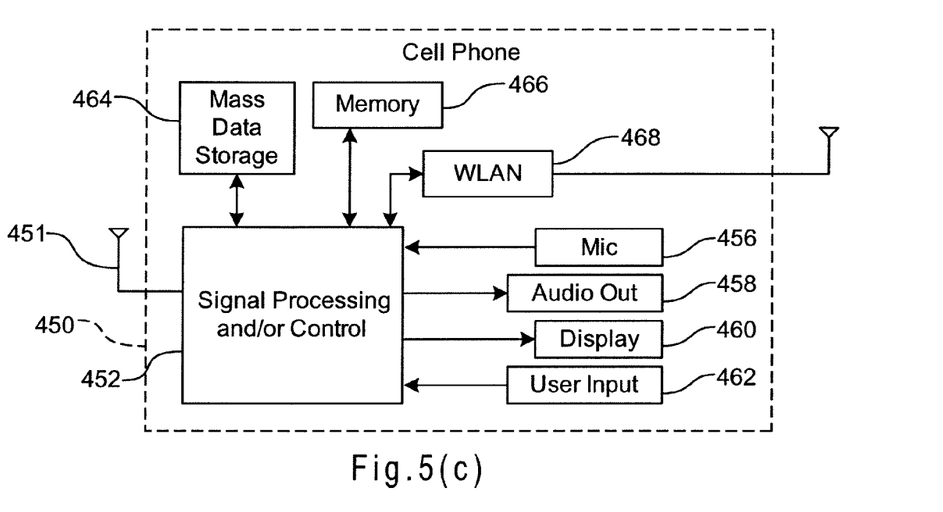
FIG. 5(c) is a functional block diagram of a cellular phone.

The cellular phone 450 may communicate with mass data storage 464 that stores data in a nonvolatile manner such as optical and/or magnetic storage devices, for example HDDs and/or DVD drives. The HDD may be a mini HDD that includes one or more platters having a diameter that is smaller than approximately 1.8". The cellular phone 450 may be connected to memory 466 such as RAM, ROM, low latency nonvolatile memory such as flash memory, and/or other suitable electronic data storage. The cellular phone 450 also may support connections with a WLAN via a WLAN network interface 468. A turbo decoder may be implemented in the signal processing and/or control circuit 452 or the WLAN interface, as examples, to decode data blocks received from a satellite network, a cellular/mobile network, a local area network, or other source.

Referring now to FIG. 5(*d*), an embodiment of the turbo decoder (not shown) of the present invention may be implemented in a set top box 480. The turbo decoder may be implemented in a signal processing and/or control circuit 484 and/or a WLAN interface 496, as examples, to decode encoded data blocks. The set top box 480 may include mass data storage 490. Set top box 480 receives signals from a source 498 (which may be a broadband source) and outputs standard and/or high definition audio/video signals suitable for a display 488 such as a television and/or monitor and/or other video and/or audio output devices. Signal processing and/or control circuit 484 and/or other circuits (not shown) of the set top box 480 may process data, perform coding and/or encryption, perform calculations, format data and/or perform any other set top box function.

Figure 5D:
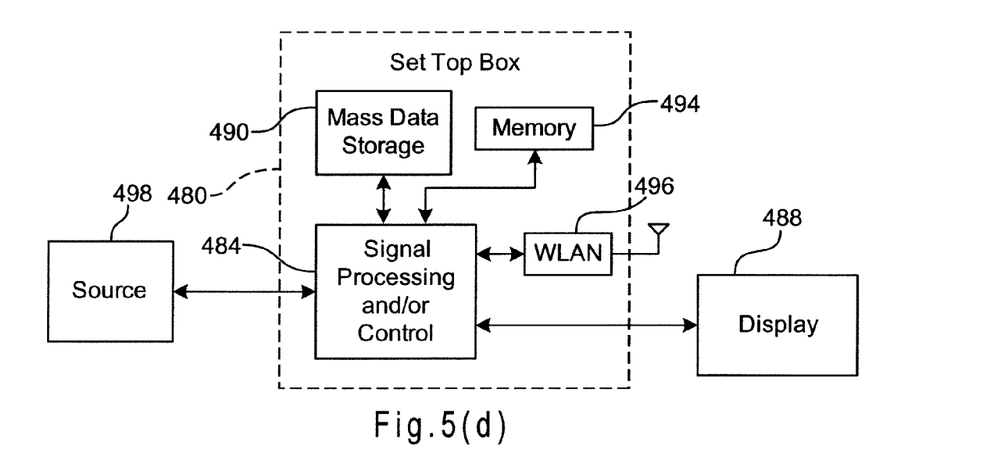
FIG. 5(d) is a functional block diagram of a set top box.

Set top box 480 may communicate with mass data storage 490 that stores data in a nonvolatile manner. Mass data storage 490 may include optical and/or magnetic storage devices, for example HDDs and/or DVD drives. The HDD may be a mini HDD that includes one or more platters having a diameter that is smaller than approximately 1.8". Set top box 480 may be connected to memory 494 such as RAM, ROM, low latency nonvolatile memory such as flash memory, and/or other suitable electronic data storage. Set top box 480 also may support connections with a WLAN via the WLAN network interface 496. A turbo decoder may be implemented in the signal processing and or control circuit 484 and/or the WLAN interface 496, as examples, to decode data blocks received from a satellite network, a cellular/mobile network, a local area network, or other source.

Referring now to FIG. 5(*e*), an embodiment of the turbo decoder (not shown) of the present invention may be embodied in a media player 500. The turbo decoder may be implemented in a signal processing and/or control circuit 504 or a WLAN interface 516 to decode encoded data blocks. The media player may include mass data storage 510. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuit 504 and/or other circuits (not shown) of media player 500 may process data, perform coding and/or encryption, perform calculations, format data and/or perform any other media player function.

Figure 5E:
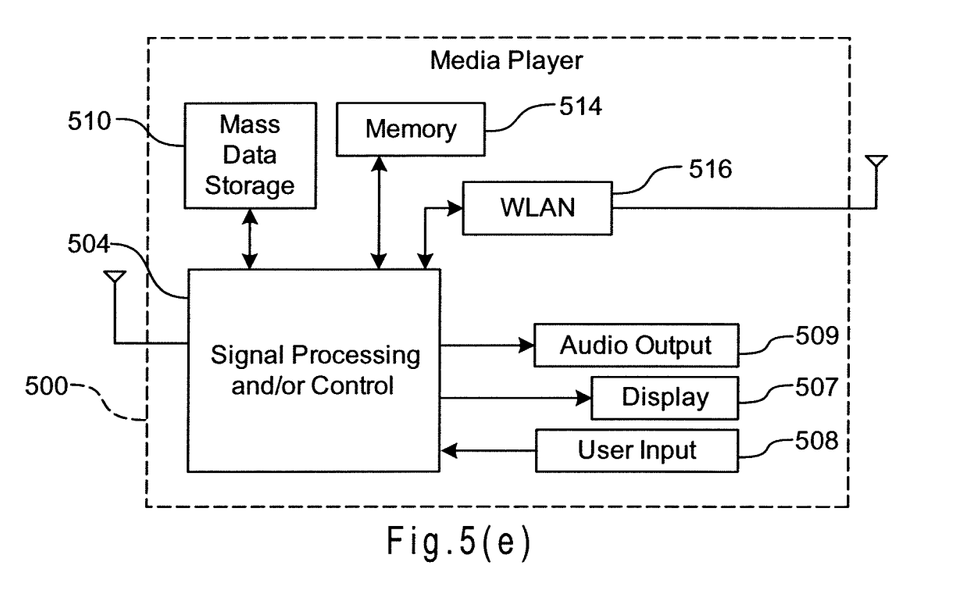
FIG. 5(e) is a functional block diagram of a media player.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include optical and/or magnetic storage devices, for example HDDs and/or DVD drives. The HDD may be a mini HDD that includes one or more platters having a diameter that is smaller than approximately 1.8".

Media player 500 may be connected to memory 514 such as RAM, ROM, low latency nonvolatile memory such as flash memory and/or other suitable electronic data storage. Media player 500 also may support connections with a WLAN via a WLAN network interface 516. A turbo decoder may be implemented in the signal processing and/or control circuit 504, the WLAN interface 516 or other component of the media player 500 to decode encoded data blocks received from a satellite network, a cellular/mobile network, a local area network, or other source. Still other implementations in addition to those described above are contemplated.

Figure 5F:
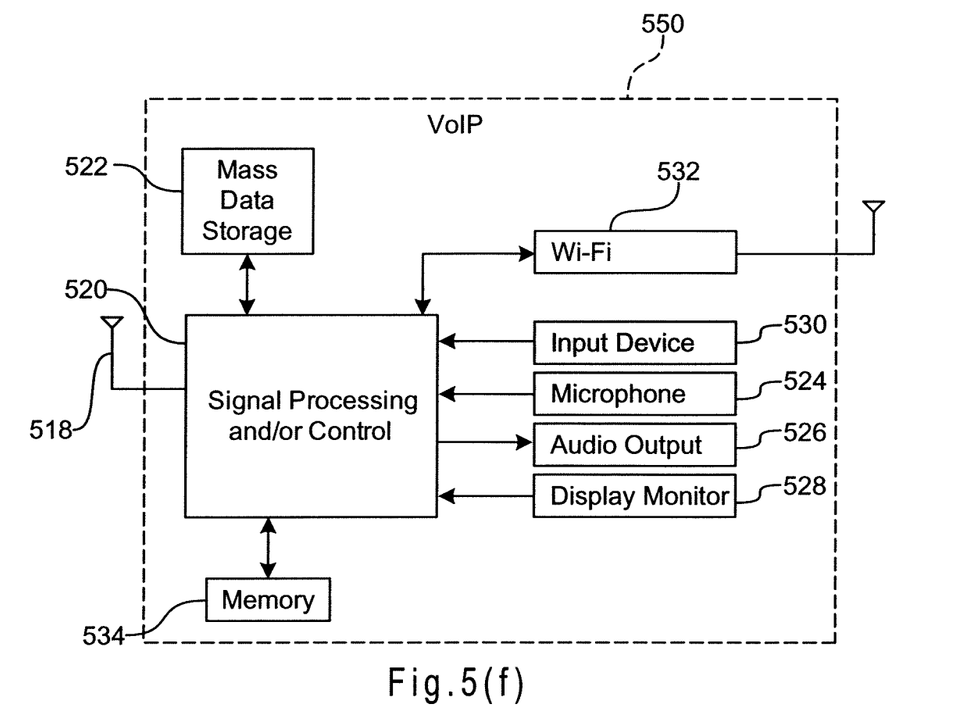
FIG. 5(f) is a functional block diagram of a VoIP phone.

Referring to FIG. 5(f), an embodiment of the turbo decoder (not shown) of the present invention may be embodied in a Voice over Internet Protocol (VoIP) phone 550 that may include an antenna 518. The VoIP phone 550 may include mass data storage 522. In some implementations, VoIP phone 550 includes, in part, a microphone 524, an audio output 526 such as a speaker and/or audio output jack, a display monitor 528, an input device 530 such as a keypad, pointing device, voice actuation and/or other input devices, and a Wi-Fi communication module 532. A turbo decoder may be implemented in the signal processing and/or control circuit 520 and/or a Wi-Fi communication module 532, as examples, to decode encoded data blocks received from a satellite network, a cellular/mobile network, a local area network, or other source. Signal processing and/or control circuits 520 and/or other circuits (not shown) in VoIP phone 550 may process data, perform coding and/or encryption, perform calculations, format data and/or perform other VoIP phone functions.

VoIP phone 550 may communicate with mass data storage 522 that stores data in a nonvolatile manner such as optical and/or magnetic storage devices, for example HDDs and/or DVD drives. The HDD may be a mini HDD that includes one or more platters having a diameter that is smaller than approximately 1.8". VoIP phone 550 may be connected to memory 534, which may be a RAM, ROM, low latency nonvolatile memory such as flash memory and/or other suitable electronic data storage. VoIP phone 550 may be configured to establish a communication link with a VoIP network (not shown) via Wi-Fi communication module 532.

All of the discussion above, regardless of the particular implementation being described, is exemplary in nature, rather than limiting. Although specific components of a turbo decoder are described, methods, systems, and articles of manufacture consistent with the turbo decoder may include additional or different components. For example, components of the turbo decoder may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the turbo decoder may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the invention can take and not as a definition of the invention. It is only the following claims, including all equivalents, that are intended to define the scope of this invention.

What is claimed is:

1. A method comprising:

decoding in parallel a first set of data blocks and a second set of data blocks using a first decoder processor of a decoder and a second decoder processor of the decoder, the first set of data blocks and the second set of data blocks having memory addresses associated with a plurality of non-overlapping memory banks;

sorting the decoded first set of data blocks to a first plurality of buffers or a second plurality of buffers depending on the memory addresses of the first set of data blocks, the first plurality of buffers being associated with a first memory bank of the plurality of non-overlapping memory banks, and the second plurality of buffers being associated with a second memory bank of the plurality of non-overlapping memory banks;

sorting the decoded second set of data blocks to the first plurality of buffers or the second plurality of buffers depending on the memory addresses of the second set of data blocks;

selecting one of the decoded first set of data blocks or one of the decoded second set of data blocks from the first plurality of buffers and communicating the one of the decoded first set of data blocks or the one of the decoded second set of data blocks from the first plurality of buffers to the first memory bank; and selecting one of the decoded first set of data blocks or one of the decoded second set of data blocks from the second plurality of buffers and communicating the one of the decoded first set of data blocks or the one of the decoded second set of data blocks from the second plurality of buffers to the second memory bank;

reading the one of the decoded first set of data blocks or the one of the decoded second set of data blocks from the first memory bank; and processing the one of the decoded first set of data blocks or the one of the decoded second set of data blocks through a systematic iteration.

2. The method of claim 1, wherein decoding in parallel the first set of data blocks and the second set of data blocks comprises decoding the first set of data blocks and the second set of data blocks by iteratively processing the first and second sets of data blocks through systematic iterations and interleaver iterations.

3. The method of claim 1 wherein processing the one of the decoded first set of data blocks or the one of the decoded second set of data blocks through the systematic iteration includes processing the selected data block according to the Bahl, Cocke, Jelinek and Raviv (BCJR) algorithm.

4. The method of claim 1, wherein processing the one of the decoded first set of data blocks or the one of the decoded second set of data blocks comprises processing the one of the decoded first set of data blocks or the one of the decoded second set of data blocks from the first memory bank with parity data to update a logarithm of likelihood ratio (LLR), wherein the LLR indicates a probability of a status of a bit as either a zero or a one.

5. A wireless receiver comprising:
a plurality of decoder circuits, including a first decoder circuit and a second decoder circuit, operative to decode in parallel encoded data blocks comprising a first set of data blocks and a second set of data blocks that are received by the wireless receiver;
a plurality of non-overlapping memory banks, wherein each memory bank of the plurality of memory banks is in communication with the first decoder circuit and the second decoder circuit of the plurality of decoder circuits, the first set of data blocks and the second set of data blocks having memory addresses associated with the plurality of non-overlapping memory banks;
a first plurality of buffers associated with a first memory bank of the plurality of memory banks;
a second plurality of buffers associated with a second memory bank of the plurality of memory banks;
a sorting circuit configured to:
receive the decoded first set of data blocks from the first decoder circuit and the second set of data blocks from the second decoder circuit;
selectably communicate the decoded first set of data blocks and the decoded second set of data blocks to the first plurality of buffers and the second plurality of buffers depending on the memory addresses of the first set of data blocks and the second set of data blocks; and a routing circuit configured to:
communicate at least one data block of the decoded first set of data blocks or at least one data block of the decoded second set of data blocks from the first plurality of buffers to the first memory bank; and
communicate at least one data block of the decoded first set of data blocks or at least one data block from the decoded second set of data blocks from the second plurality of buffers to the second memory bank; and
a processor configured to receive the first data block from the first memory bank and systematically process the first data block through a systematic iteration.

6. The wireless receiver of claim 5 wherein the routing circuit is configured to communicate the at least one block of the decoded first set of data blocks or the at least one block of the second set of data blocks to the first memory bank according to a sequence.

7. The wireless receiver of claim 5 wherein the routing circuit is configured to communicate the at least one block of the decoded first set of data blocks or the at least one block of the second set of data blocks to the second memory bank according to a sequence.

8. The wireless receiver of claim 5 wherein the routing circuit comprises:
a first router in communication with the first plurality of buffers, the first router configured to de-queue the decoded first set of data blocks or the decoded second set of data blocks in the first plurality of buffers according to a priority; and
a second router in communication with the second plurality of buffers, the second router configured to de-queue the decoded first set of data blocks or the second set of data blocks in the second plurality of buffers according to a priority.

9. The wireless receiver of claim 5 wherein the plurality of decoder circuits is configured to decode systematic bits in a signal received by the wireless receiver.

10. The wireless receiver of claim 5, wherein the wireless receiver is embodied in a cellular telephone in communication with a cellular network.

11. The wireless receiver of claim 5, wherein the wireless receiver is embodied in a first electronic device in wireless communication with a second electronic device.

12. A method comprising:
receiving an encoded data block and dividing the encoded data block into a plurality of data blocks, including a first data block and a second data block;
systematically processing, using a first decoding processor and a second decoding processor connected in parallel, the first data block and the second data block;
assigning to the first data block of encoded data a first address within a first memory bank that is within a plurality of non-overlapping memory banks;
assigning to the second data block of encoded data a second address within a second memory bank that is within the plurality of non-overlapping memory banks;
sorting the decoded first data block to a first queue associated with the first memory bank or a second queue associated with the second memory bank;
sorting the decoded second data block to the first queue or the second queue;
reading the first data block from the first queue or the second queue and writing the first data block to the first memory bank or the second memory bank depending on the first data block sorted in the first queue or the second queue;
reading the second data block from the first queue or the second queue and writing the second data block to the first memory bank or the second memory bank depending on the second data block sorted in the first queue or the second queue; and
reading the first data block or the second data block from the first memory bank; and
processing the first data block and the second data block through a systematic iteration.

13. The method of claim 12 wherein processing the first data block and the second data block through a systematic iteration comprises processing the first data block with first parity data and processing the second data block with second parity data.

14. An apparatus comprising:
a plurality of decoding processors connected in parallel, including a first decoding processor and a second decoding processor, the plurality of decoding processors being configured to process, by decoding in parallel, a first data block of encoded data and a second data block of encoded data through a systematic iteration;
a first interleaver configured to assign to the first data block of encoded data a first address within a first memory bank within a plurality of memory banks or a second address within a second memory bank within the plurality of memory banks, wherein the plurality of memory banks are internal to a single memory module;

a second interleaver configured to assign to the second data block of encoded data a second address within the first memory bank or the second memory bank;

a sorter configured to sort the decoded first data block to a first plurality of queues associated with the first memory bank; and to sort the decoded second data block to a second plurality of queues associated with the second memory bank; and a router configured to read the decoded first data block from the first plurality of queues and communicate the first data block to the first memory bank; and a processor configured to process the decoded first data block and the second data block through a subsequent systematic iteration.

15. The apparatus of claim 14 wherein the processor is configured to systematically process the first data block to update a parameter indicative of a status of a bit as either a zero or a one.

16. The apparatus of claim 14 wherein the plurality of decoding processors each operate at more than one-half of a maximum operating speed of the of the memory module.

17. The apparatus of claim 14 wherein the processor is further configured to represent a data bit by a first group of control bits, and interleave the first group of control bits with at least a second group of control bits to provide the first data block of encoded data.

18. The apparatus of claim 14, wherein the router is further configured to read the decoded second data block from the second plurality of queues and communicate the second data block to the second memory bank.

* * * * *